United States Patent
Qin et al.

(10) Patent No.: US 7,698,582 B2
(45) Date of Patent: Apr. 13, 2010

(54) APPARATUS AND METHOD FOR COMPENSATING DIGITAL INPUT DELAYS IN AN INTELLIGENT ELECTRONIC DEVICE

(75) Inventors: Bai-Lin Qin, Pullman, WA (US); Max B. Ryan, Moscow, ID (US); Daniel P. Dwyer, Pullman, WA (US); Carl V. Mattoon, Pullman, WA (US)

(73) Assignee: Schweitzer Engineering Laboratories, Inc., Pullman, WA (US)

(*) Notice: Subject to any disclaimer, the term of this patent is extended or adjusted under 35 U.S.C. 154(b) by 666 days.

(21) Appl. No.: 11/614,869

(22) Filed: Dec. 21, 2006

(65) Prior Publication Data

US 2007/0150214 A1    Jun. 28, 2007

Related U.S. Application Data

(60) Provisional application No. 60/753,710, filed on Dec. 23, 2005.

(51) Int. Cl.
*G06F 1/26* (2006.01)

(52) U.S. Cl. .................. 713/300; 713/500; 713/502

(58) Field of Classification Search ............... 713/300, 713/500, 502
See application file for complete search history.

(56) References Cited

U.S. PATENT DOCUMENTS 4,545,029 A * 10/1985 Collier ............... 713/503
5,208,545 A    5/1993  Schweitzer
5,315,539 A    5/1994  Hawes
5,680,324 A *  10/1997 Schweitzer et al. ...... 370/241
6,272,181 B1   8/2001  Matt
6,363,025 B1   3/2002  McLaury
6,429,785 B1 * 8/2002  Griffin et al. ......... 340/870.02
6,633,825 B2 * 10/2003 Burns et al. .............. 702/61
6,639,413 B2   10/2003 Whitehead
6,859,742 B2 * 2/2005  Randall et al. ............ 702/61
6,975,695 B1   12/2005 Kuhn
2003/0220752 A1  11/2003 Hart
2005/0041767 A1  2/2005  Whitehead
2005/0273281 A1  12/2005 Wall
2006/0259806 A1  11/2006 Zweigle

* cited by examiner

*Primary Examiner*—Nitin C Patel
(74) *Attorney, Agent, or Firm*—Eugene M. Cummings, P.C.

(57) ABSTRACT

An apparatus and method for compensating digital input delay in an intelligent electronic device is provided. A method is provided which provides for accurate SER data recording while facilitating the reduction of processing burden on the IED and optimization of system performance during the processing of SER data flow. An apparatus is further provided which generally includes a time delay element coupled to a sequential events recorder for compensating for delay in communication of a data signal such that the sequential events recorder records a compensated time for a select event based on the clock and the time delay. An apparatus is provided which includes an edge detection element for detecting either a rising or falling edge from the data signal.

23 Claims, 8 Drawing Sheets

APPARATUS AND METHOD FOR COMPENSATING DIGITAL INPUT DELAYS IN AN INTELLIGENT ELECTRONIC DEVICE

CROSS-REFERENCE TO RELATED APPLICATIONS

This application claims benefit under 35 U.S.C. § 119(e) of U.S. Provisional Application entitled "Apparatus and Method for Compensating Digital Input Delays in an Intelligent Electronic Device," filed on Dec. 23, 2005, having Ser. No. 60/753,710, naming Bai-Lin Qin, Max Ryan, Dan Dwyer and Carl Mattoon as inventors, the complete disclosure thereof being incorporated by reference.

BACKGROUND OF THE INVENTION

The present invention generally relates to an intelligent electronic device, and more specifically, to an apparatus and method for compensating digital input delays and communication delays in and between an intelligent electronic device.

Electric power systems are designed to generate, transmit and distribute electrical energy to loads. In order to accomplish this, power systems generally include a variety of power system elements such as electrical generators, electrical motors, power transformers, power transmission lines, buses and capacitors, to name a few. As a result, power systems typically include intelligent electronic devices (IEDs) in communication with power system elements for protection, monitoring, controlling, metering or automation of at least a portion of the power system. For example, an IED may communicate with a power system element in order to protect a portion of the power system from abnormal conditions such as electrical short circuits, overloads, frequency excursions, voltage fluctuations, and the like. IEDs used in an electric power system may generally include protective relays or otherwise, remote terminal units (RTUs), power line communication devices (PLCs), bay controllers, supervisory control and data acquisition (SCADA) systems, general computer systems, meters, and any other comparable devices used for protecting, monitoring, controlling, metering and/or automating a portion of the electric power system.

In some cases, IEDs may include a recording function generally referred to as a sequential event recorder (SER) adapted to record and time-stamp a variety of events associated with an associated power system element. A SER may be adapted to provide a report which generally includes the date, time, power system element name or type, and an event associated with the power system element (e.g., the state of the power system element). Some IEDs are referred to as SERs, wherein their dedicated function is to record and time-stamp a variety of events associated with an associated power system element.

For example, one typical IED including a SER is a protective relay having a SER that provides information on what are generally known in the art as relay word bit states and relay element operations. Relay word bits are generally known in the art to refer to binary states such as relay protection logic inputs or outputs, the general operation of the power system element, or the power up or shutdown sequences of the power system element. Relay element operations are generally known in the art to include operations such as relay power up, relay enable and disable, settings changes, and SER automatic removal and reinsertion. A SER may also record state changes. For example, a SER may record state changes via user specified relay word bits listed in what are known as SER trigger equations.

In general, traditional SERs used in conventional power system IEDs are deficient in that they have a general inability to compensate for time delays in communication of the data signal between the IED and the power system element or among various elements within the IED. As a result, the reports provided by a SER of an IED may be generally incorrect due to the lack of compensation for such time delays. For example, the IED may provide a report containing time-stamped events which are listed in a generally incorrect chronological order causing for difficult analysis.

Accordingly, it is an object of the present invention to provide an apparatus and method for compensating for time delays in communication of the data signal between the IED and the power system element or among various elements within the IED. It is further an aspect of the present invention to provide an apparatus or method for providing a SER report containing time-stamped events which are listed in a generally correct chronological order.

Some conventional IEDs comprising a SER are further deficient in that they are generally unable to detect accidental state changes in the power system element. For example, a power system element may be adapted to include a mechanical contact which is actuated upon the changing of the status of the power system element. The mechanical contact may have an electrical contact which is actuated a plurality of times during an initial mechanical contact. The plurality of actuations of the electrical contact may cause a ripple or bouncing in the resulting data signal which is communicated from the power system element to the IED. Conventional IEDs having a SER are generally deficient in that they are unable to accurately discern between a valid data signal and an accidental data signal. Conventional IEDs are further deficient in that they are generally unable to compensate for the time delay due to such bouncing or ripple in the data signal. As such, conventional IEDs having a SER often record an accidental data signal erroneously as a valid data signal.

Accordingly, it is an object of the present invention to provide an apparatus and method for accurately discerning between a valid data signal and an accidental data signal while also accurately associating a time with the data related thereto using a novel edge detection element. It is further an object of the present invention to provide an apparatus and method for compensating for the time delay due to such bouncing or ripple in the data signal. A present invention method is also provided which facilitates the reduction of processing burden of the IED and optimization of system performance.

These and other desired benefits of the preferred embodiments, including combinations of features thereof, of the invention will become apparent from the following description. It will be understood, however, that a process or arrangement could still appropriate the claimed invention without accomplishing each and every one of these desired benefits, including those gleaned from the following description. The appended claims, not these desired benefits, define the subject matter of the invention. Any and all benefits are derived from the multiple embodiments of the invention, not necessarily the invention in general.

SUMMARY OF THE INVENTION

Provided is a method and apparatuses for processing sequential events recorder data associated with a power system element for protection, monitoring, controlling, metering or automation of a portion of an electrical power system. The data associated with the power system element is transmitted from the power system element to an intelligent electronic device, wherein a delay occurs either in the communication of data from the power system element to the intelligent electronic device or in the communication of data within elements of the intelligent electronic device.

The present invention method generally includes the steps of associating the data with a select time reference, correcting the time reference associated with the data by compensating for the time of the delay in the communication of the data, sorting the data based on the corrected time reference, and reporting the data in an order based on the correct time reference associated therewith. The present invention method provides for accurate recording of SER data while facilitating the reduction of processing burden of the IED and optimization of system performance during the processing of SER data flow.

An apparatus according to an embodiment of the present invention is further provided which generally includes a time delay element coupled to a sequential events recorder for compensating for delay in communication of a data signal such that the sequential events recorder records a compensated time for a select event based on the clock and the time delay. More specifically, the apparatus includes a sequential events recorder adapted to receive the data signal and record the select event associated with the power system element. A clock is in communication with the sequential events recorder such that the sequential events recorder is adapted to associate a time with the select event based on the clock. A time delay element is coupled to the sequential events recorder, wherein the time delay element compensates for delay in communication of the data signal such that the sequential events recorder records a compensated time for the select event based on the clock and the time delay.

An apparatus according to another embodiment of the present invention includes an edge detection element for detecting either a rising or falling edge from the data signal. More specifically, the apparatus includes an edge detection element adapted to receive the data signal and detect a rising or falling edge of the data signal. The edge detection element is further adapted to transmit a signal upon detection of a rising or falling edge of the data signal. A sequential events recorder is in communication with the edge detection element, wherein said sequential events recorder is adapted to record the event associated with the power system element upon receipt of the signal from the edge detection element.

It should be understood that the present invention includes a number of different aspects and/or features which may have utility alone and/or in combination with other aspects or features. Accordingly, this summary is not an exhaustive identification of each such aspect or feature that is now or may hereafter be claimed, but represents an overview of certain aspects of the present invention to assist in understanding the more detailed description that follows. The scope of the invention is not limited to the specific embodiments described below, but is set forth in the claims now or hereafter filed.

DETAILED DESCRIPTION OF THE INVENTION

Figure 1:
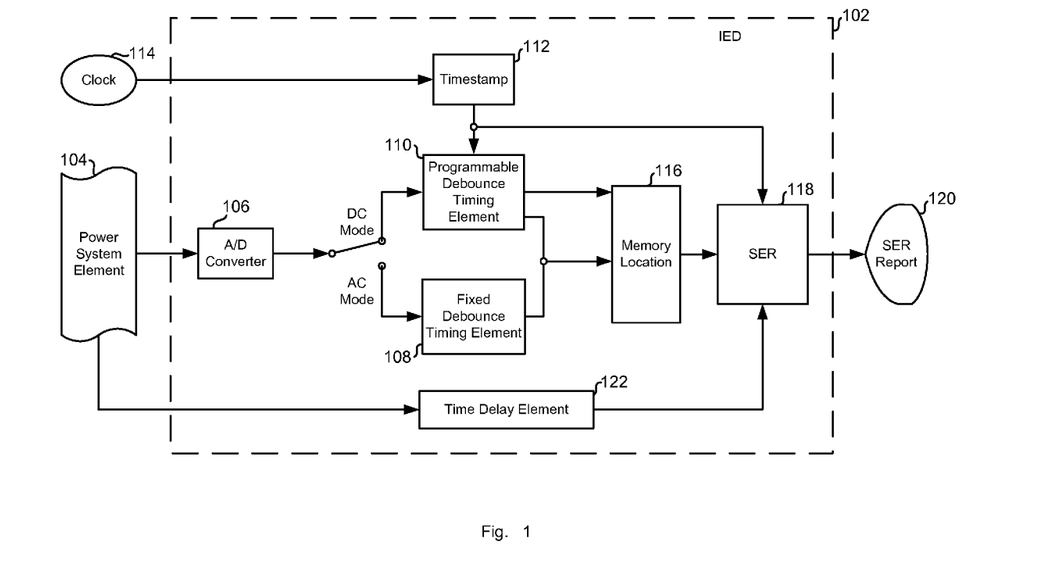
FIG. 1 is a circuit diagram of a system including an apparatus for compensating digital input delays in an intelligent electronic device according to an embodiment of the present invention.

According to an aspect of the invention, as generally illustrated in FIG. 1, an IED 102 is provided for communication with a power system element 104 for protection, monitoring, controlling, metering or automation of a portion of an electrical power system. The power system element 104 may generally include electrical generators, electrical motors, power transformers, power transmission lines, distribution lines, buses and capacitors, to name a few. The power system element 104 may also generally include circuit breakers, disconnect switches or any other related power system elements having what is known as a contact input. Moreover, the IED 102 may generally include a SER, protective relays, RTUs, PLCs, bay controllers, SCADA systems, general computer systems, meters, and any other comparable devices used for protecting, monitoring, controlling, metering and/or automating a portion of the electric power system. For purposes of this invention, although only one power system element is shown, the IED 102 may be adapted to communicate with a plurality of power system elements.

The power system element 104 is generally adapted to communicate a data signal related to a select event associated with the power system element 104 to the IED 102. For example, the event may include a change of status of the power system element 104. In another example, the event may include IED word bits (e.g., relay word bits). Such IED word bits may include binary states such as logic inputs or outputs for protection, monitoring, controlling, metering or automation functions associated with the power system element 104; the general operation of the power system element 104; or the power up or shutdown sequences of the power system element 104. In yet another example, the event may include IED operations such as IED power up, IED enable and disable, settings changes, and SER automatic removal and reinsertion. The data signal is converted from an analog to a digital data signal via analog-to-digital (A/D) converter 106 of the IED, although the data signal may also be converted outside of the IED (e.g., within the power system element) or not converted at all.

According to an embodiment of the present invention, the IED 102 is adapted to process a data signal from a power system element 104 having a DC contact control voltage or an AC contact control voltage. As will be discussed in further detail below, if the data signal is associated with a power system element having an AC contact control voltage, the data signal is transferred from the A/D converter 106 to an optional fixed debounce timing element 108. If the data signal is associated with a power system element having a DC contact control voltage, the data signal is transferred from the A/D converter 106 to an optional programmable debounce timing element 110 having an edge detection element. In another aspect of the present invention, the system may include only one of the debounce timing elements. In yet another embodiment of the present invention, the system may include neither a fixed debounce timing element 108 nor a programmable debounce timing element 110.

A timestamp element 112 may be further coupled to the programmable debounce timing element 110. The timestamp element 112 is generally adapted to associate a time with the data of the data signal. The time is generally based upon clock 114. The clock may be a local clock, an absolute time reference, a clock associated with a global positioning system (GPS), or the like. In another embodiment (not shown), the timestamp element 112 may further be coupled to the fixed debounce timing element 108.

The data (e.g., regarding events or status changes) of the data signal is then stored in a memory location 116. The data is then processed and recorded in a sequential events recorder (SER) 118. The timestamp element 112 may be further coupled to the SER 118. The timestamp element 118 is generally adapted to associate a time with the data of the data signal. The data may be representative of events associated with the power system element 104. Accordingly, the SER may be adapted to provide a report 120 containing time-stamped events based on the data signal from the power system element. The report 120 may generally include the date, time, power system element name or type, and an event associated with the power system element (e.g., the state of the power system element). These events may be listed in chronological in order to facilitate analysis thereof.

Time delays in communication of the data signal may be present between the IED 102 and the power system element 104 or among various elements within the IED 102. According to another aspect of the present invention, a time delay element 122 is coupled to the SER for either compensating for time delays in communication of the data signal between the IED 102 and the power system element 104 or compensating for time delays among various elements within the IED 102. The time delay element 122 provides to the SER 118 the time delay associated with either communication of the data signal between the IED 102 and the power system element 104 or time delays among various elements within the IED 102. The SER uses this time delay information to adjust the time associated with the data from the power system element 104.

In one embodiment, the time delay element 122 is adjustable. For example, the user may input a time delay based on delay of communication between the IED 102 and a certain type of power system element 104. According to this aspect of the present invention, multiple different types of power system elements may be communicated or switched for use with the IED 102.

Time delay may be as a result of contact input delay between the interfaces of the IED 102 and the power system element 104. According to an aspect of the present invention, the time delay element 122 may be adapted to compensate for this contact input communication delay. In another aspect of the present invention, the IED 102 may be in network communication with the power system element 104. According to this aspect of the present invention, the time delay element 122 may be adapted to compensate for the network communication delay. In one example, the network communication may be based on a select network protocol. Network protocols often used in electric power systems include HAYES, SMI, DNP, AGA, SEL, DDF, MODBUS, IEC-61850, PROFIBUS, unstructured messaging protocols, and the like. According to this aspect of the present invention, the time delay element 122 may be adapted to compensate for the network communication delay associated with the select network protocol. Although shown as being a part of IED 102, the time delay element 122 may be separate and apart therefrom. For example, the time delay element may be a part of the power system element 104 or separate and apart from both the power system element 104 and IED 102. Furthermore, although shown as being coupled to the power system element 104, the time delay element may separate and apart therefrom.

The power system element 104 may be adapted to include a mechanical contact which is actuated upon the changing of the status of the power system element 104. The mechanical contact may have an electrical contact which is actuated a plurality of times during an initial mechanical contact. The plurality of actuations of the electrical contact may cause a ripple or bouncing in the resulting data signal which is communicated from the power system element 104 to the IED 102. The data signal communicated from the power system element 104 to the IED 102 may include a rising or falling edge indicative of an event (e.g., a change in status) associated with the power system element 104. The fixed and programmable debounce timing elements 108, 110 may be used to process a data signal having such a rising or falling edge. The fixed and programmable debounce timing elements 108, 110 may be separate elements as shown in FIG. 1 or a single element which effectively switches between a fixed debounce timing state and a programmable debounce timing state.

The system of FIG. 1 provides for a method for processing sequential events recorder data associated with a power system element 104 for protection, monitoring, controlling, metering or automation of a transmission line in an electrical power system, wherein the data associated with the power system element 104 is transmitted to an intelligent electronic device 102. The method generally includes the steps of associating the data with a select time reference, correcting the time reference associated with the data by compensating for the time of the delay in the communication of the data, sorting the data based on the corrected time reference, and reporting the data in an order based on the correct time reference associated therewith.

Figure 2:
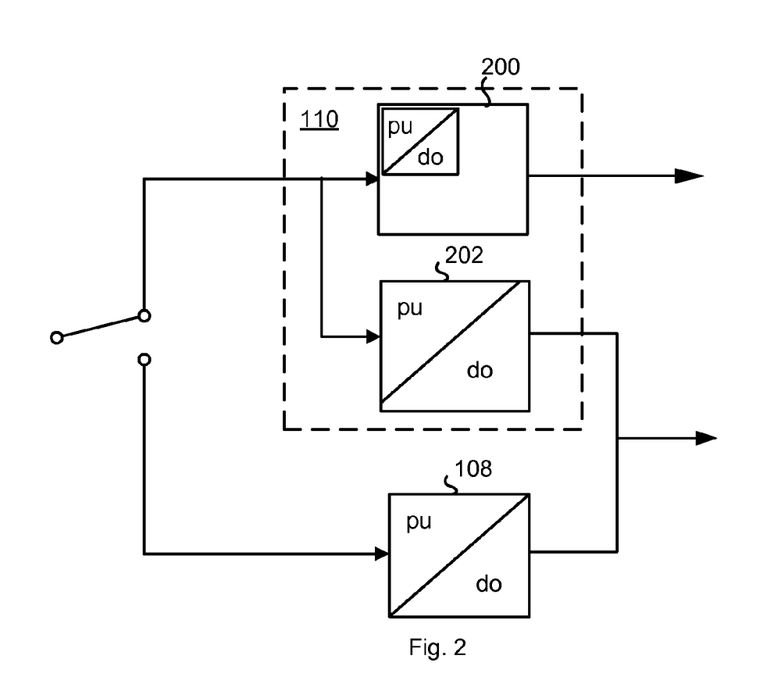
FIG. 2 is a circuit diagram of an embodiment of a fixed debounce timing element and a programmable debounce timing element having an edge detection element for use in the intelligent electronic device according to the present invention.

FIG. 2 is a detailed illustration of the optional fixed debounce timing element 108 and the optional programmable debounce timing element 110 of FIG. 1 which provides for time delay compensation associated with the debounce timing. The fixed debounce timing element 108 may be used to process a data signal in a system wherein the power system element 104 includes an AC contact control voltage. The fixed debounce timing element 108 generally includes a pickup time delay/dropout timing element having fixed values. More specifically, the fixed debounce timing element 108 provides for a select, fixed pickup time delay and a select, fixed dropout time as will be described in greater detail below.

Figure 3:
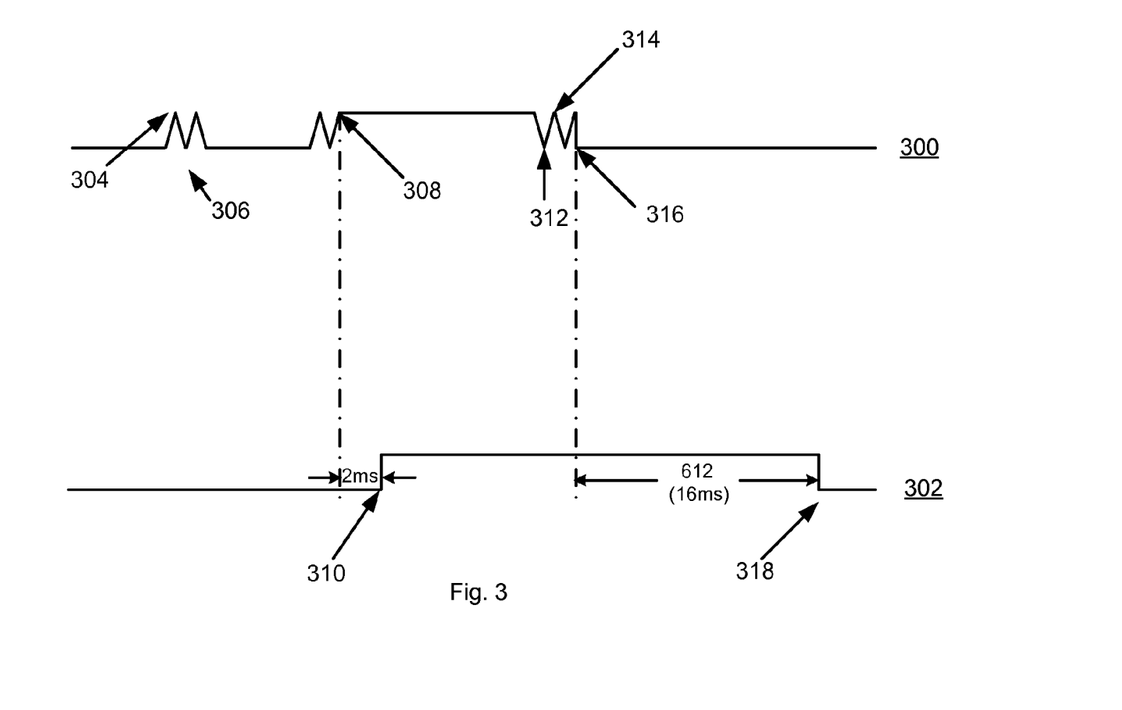
FIG. 3 is a timing diagram for the fixed debounce timing element of FIG. 2 according to an embodiment of the present invention.

FIG. 3 illustrates a timing diagram for the fixed debounce timing element 108 of FIGS. 1 and 2. The fixed debounce timing element 108 may be used to process a data signal in a system wherein the power system element 104 includes an AC contact control voltage. The timing diagram shows an example of the raw data signal 300 and the timing operation 302 corresponding to the fixed debounce timing element 108. A rising edge may be representative of an assertion of a data signal from an associated power system element, whereas a falling signal is representative of deassertion of a data signal.

More specifically, upon a rising edge of the data signal, the fixed debounce timing element 108 initiates the pickup time delay. If a falling edge is detected before the end of the pickup time delay, processing of the data signal is not initiated. For example, in FIG. 3, the pickup time delay may be set at 2 ms. Upon a rising edge shown at 304, fixed debounce timing element 108 initiates the pickup time delay. However, because a falling edge 306 is detected at about 0.5 ms after detection of the rising edge 304, processing of the data signal is not initiated as shown in the timing operation 302. However, another rising edge is shown at 308 wherein the fixed debounce timing element 108 initiates the pickup time delay. Because a falling edge is not detected before 2 ms has elapsed, processing of the data signal is initiated as shown at 310.

After processing of the data has begun, the fixed debounce timing element 108 begins to detect a falling edge in order to initiate a dropout timing element and the end of processing of the data signal. Upon a falling edge of the data signal after processing of the data signal has already begun, the fixed debounce timing element 108 initiates the dropout time delay. If a rising edge is detected before the end of the dropout time delay, processing of the data signal continues. For example, in FIG. 3, the dropout time delay is set at 16 ms. Upon a falling edge shown at 312, the fixed debounce timing element 108 initiates the dropout time delay. However, because a rising edge 314 is detected at about 0.5 ms after detection of the falling edge 312, processing of the data signal continues. However, another falling edge is shown at 316 and the fixed debounce timing element 108 initiates the dropout time delay. Because a rising edge is not detected before 16 ms has elapsed, processing of the data signal is stops as shown at 318.

The programmable debounce timing element 110 as shown in FIG. 2 is different from the fixed debounce timing element described above in that it includes both an edge detection element 200 and a debounce timing element 202. The debounce timing element 202 of the programmable debounce timing element 110 is generally similar in function to the fixed debounce timing element 108 as shown and described above. The edge detection element 200 facilitates the detection of the rising or falling edge associated with the data signal as described in detail below. The programmable debounce timing element 110 may be used to process a data signal in a system wherein the power system element 104 includes a DC contact control voltage.

Figure 4:
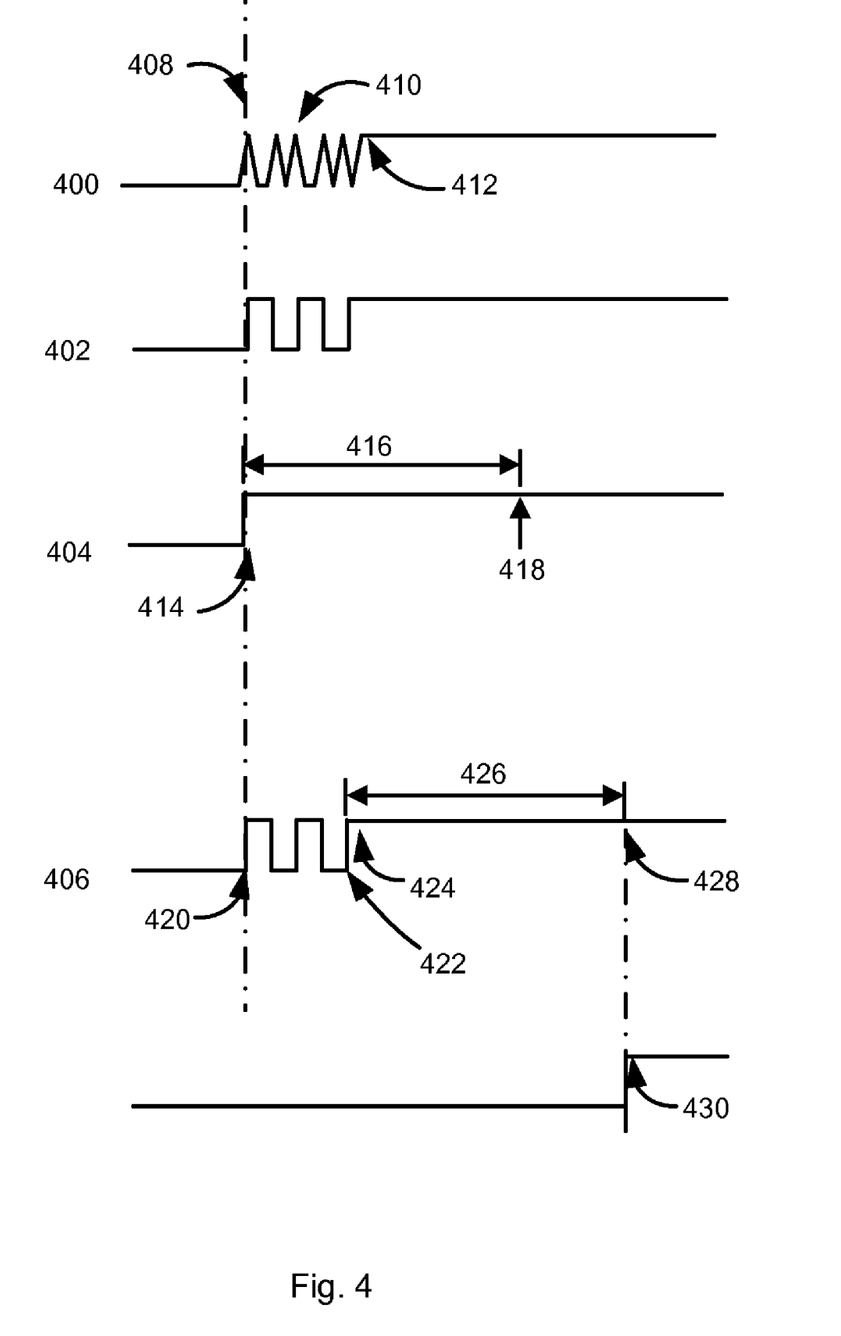
FIG. 4 is a timing diagram for the programmable debounce timing element of FIG. 2 when processing a data signal which changes from a deasserted to an asserted state according to an embodiment of the present invention.

FIG. 4 illustrates a timing diagram for the programmable debounce timing element 110 having an edge detection element 200 and associated with a debounce timing element 202. The timing diagram shows an example of an analog raw data signal 400 and the corresponding digital raw data signal 402. The timing diagram of FIG. 4 further shows the timing operation 404 of the edge detection element 200 and the timing operation 406 of the debounce timing element 202.

In the example illustrated in FIG. 4, a rising edge of a data signal is detected by the edge detection element 200 at 408. Contact bouncing is further shown at 410, whereas a solid contact assertion is shown at 412. Upon detection of the rising edge 408 of the data signal, the edge detection element 200 is initiated as shown at 414. During this timing period as shown at 416 all edges from the ripple or bouncing 420 of the data signal is ignored for a select period of time. At the end of the timing period as shown at 418, the edge detection element 200 evaluates the status of the raw data (i.e., considers the edge of the data signal) and sets the output signal of the edge detection element 200 to this value. In FIG. 4, this is value is shown as a logical 1.

At the same time, the debounce timing element 202 of the programmable debounce timing element 110 operates similar to the fixed debounce timing element 108 as described with respect to FIG. 3. Upon a rising edge shown at 420, the debounce timing element 202 initiates the dropout time delay. However, because a falling edge is detected before the pickup time delay, processing of the data is not initiated. However, another rising is shown at 422 and the debounce timing element 202 initiates the dropout time delay as shown at 424. Because a falling edge is not detected before pickup delay has elapsed, processing of the data signal occurs for a duration as shown at 426 until the timing element elapses as shown at 428. If the raw data signal remains asserted for the duration of 426 of the debounce timing element 202, the output signal 430 from the debounce timing element 202 is asserted.

Figure 5:
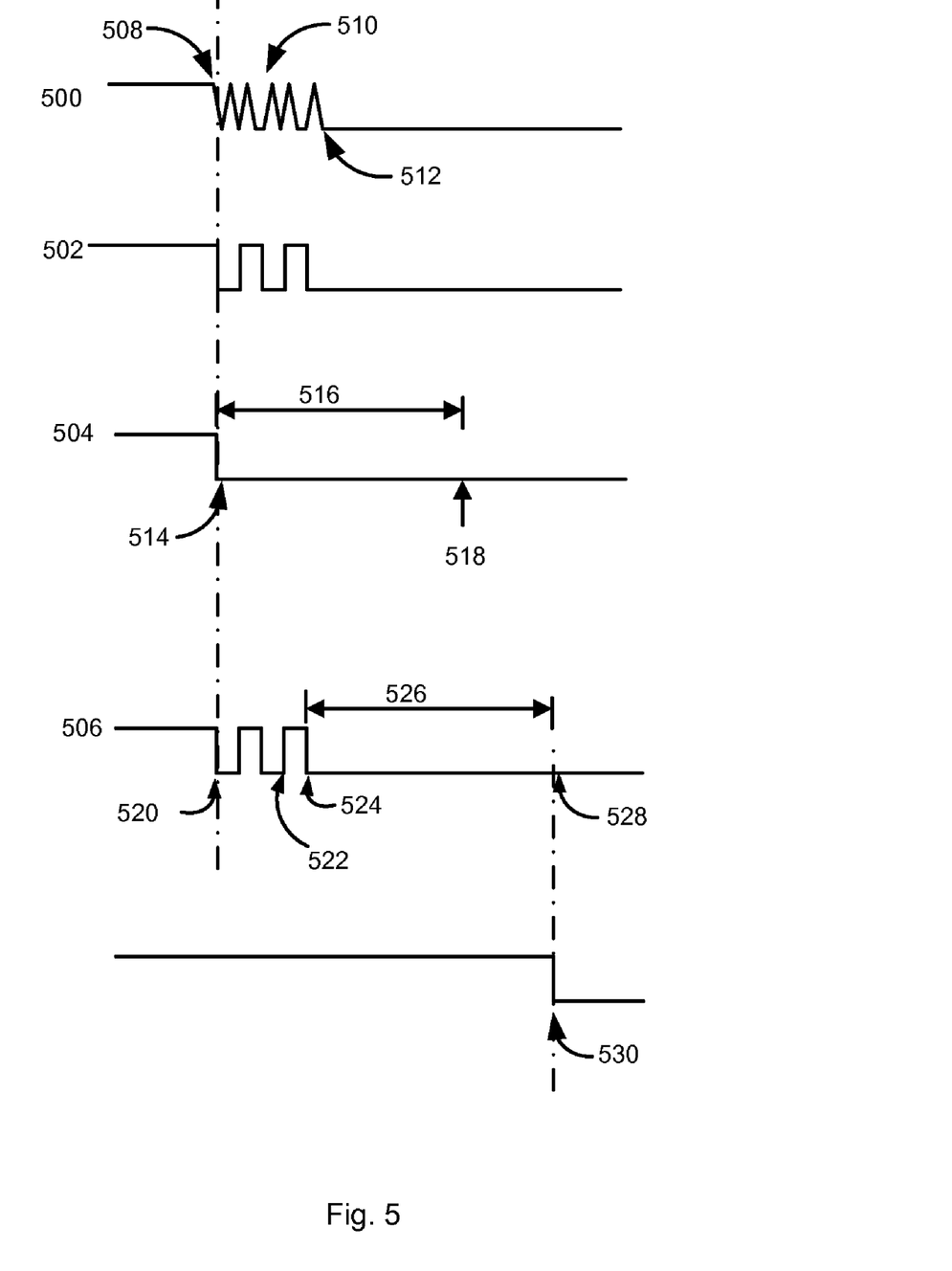
FIG. 5 is a timing diagram for the programmable debounce timing element of FIG. 2 when processing a data signal which changes from an asserted to a deasserted state according to an embodiment of the present invention.

It is to be noted that for processing a data signal which changes from an asserted to a deasserted state, the inverse waveform of the above applies as shown in FIG. 5. More specifically, FIG. 5 illustrates a timing diagram for the programmable debounce timing element 110 having an edge detection element 200 and associated with a debounce timing element 202. The timing diagram shows an example of an analog raw data signal 500 and the corresponding digital raw data signal 502. The timing diagram of FIG. 5 further shows the timing operation 504 of the edge detection element 200 and the timing operation 506 of the debounce timing element 202.

In the example illustrated in FIG. 5, a falling edge of a data signal is detected by the edge detection element 200 at 508. Contact bouncing is further shown at 510, whereas a solid contact deassertion is shown at 512. Upon detection of the falling edge 508 of the data signal, the edge detection element 200 is initiated as shown at 514. During this timing period as shown at 516 all edges from the ripple or bouncing 520 of the data signal is ignored for a select period of time. At the end of the timing period as shown at 518, the edge detection element 200 evaluates the status of the raw data (i.e., considers the edge of the data signal) and sets the output signal of the edge detection element 200 to this value. In FIG. 5, this is value is shown as a logical 0.

At the same time, the debounce timing element 202 of the programmable debounce timing element 110 operates similar to the fixed debounce timing element 108 as described with respect to FIG. 3. Upon a falling edge shown at 520, the debounce timing element 202 initiates the dropout time delay. However, because a rising edge is detected before the pickup time delay, processing of the data is not initiated. However, another falling is shown at 522 and the debounce timing element 202 initiates the dropout time delay as shown at 524. Because a rising edge is not detected before pickup delay has elapsed, processing of the data signal occurs for a duration as shown at 526 until the timing element elapses as shown at 528. If the raw data signal remains deasserted (logical 0) for the duration of 526 of the debounce timing element 202, the output signal 530 from the debounce timing element 202 is deasserted.

Figure 6:
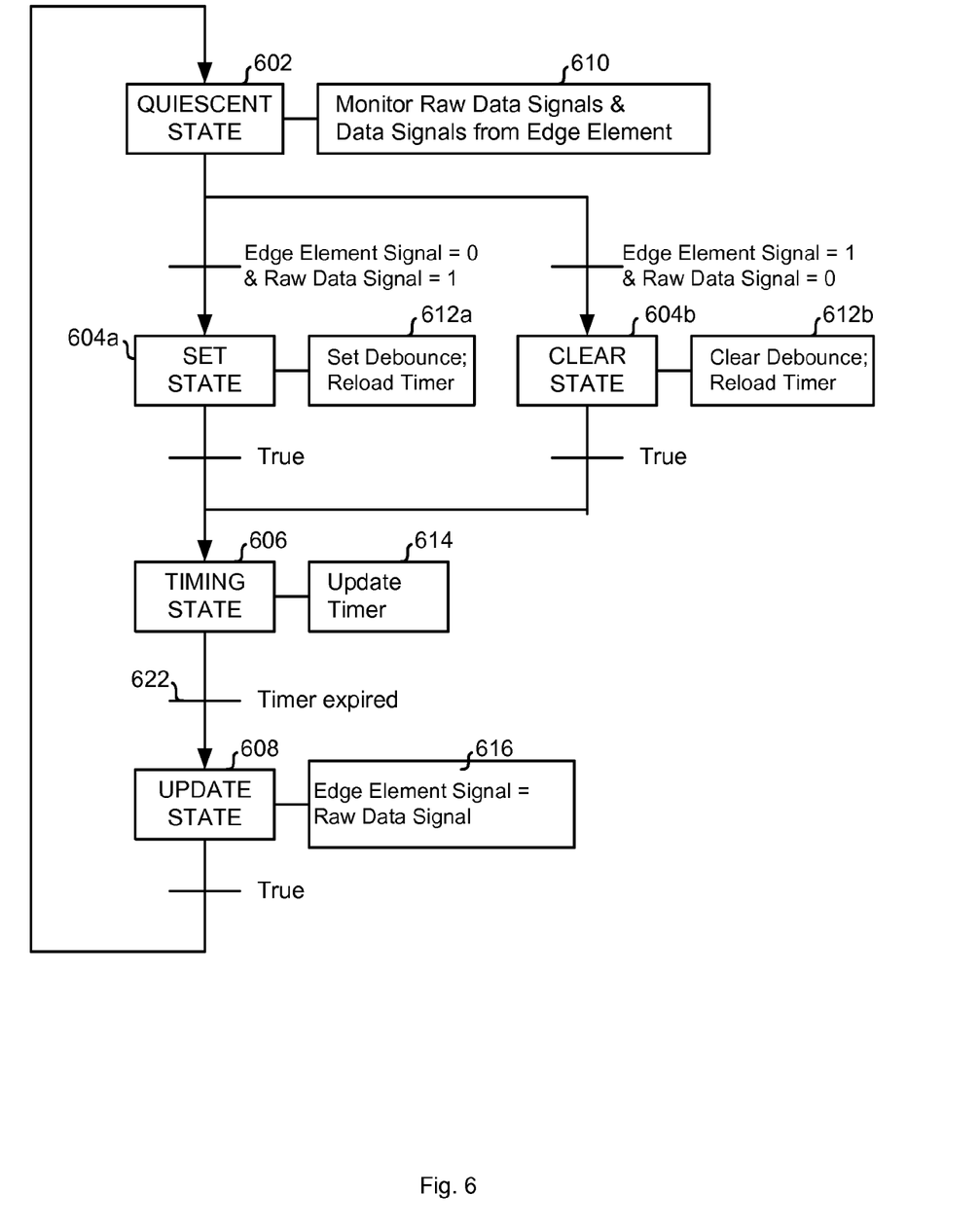
FIG. 6 is flow chart illustrating the timing logic steps of the edge detection element of the programmable debounce timing element of FIG. 2 according to an embodiment of the present invention.

The timing logic steps of the edge detection element 200 are generally shown in FIG. 6. The edge detection element 200 generally includes four states: a quiescent state 602; a state wherein the edge detection element is set or cleared 604*a*, 604*b*; a timing state 606; and a state wherein the edge detection element is updated 608.

During the quiescent state 602, the raw data signal and the data signal from the edge detection element 200 are monitored for rising and falling edges as shown at 610. If there is rising edge in the raw data signal (where the raw data signal is set at a logical 1 whereas the edge detection element is set at a logical 0), the edge detection element is asserted to begin processing and the debounce timing element 202 is reloaded as shown at 604*a* and 612*a*. If there is falling edge in the raw data signal (where the raw data signal is set at a logical 0 whereas the edge detection element is set at a logical 1), the edge detection element 200 is cleared and the debounce timing element 202 is reloaded as shown at 604*b* and 612*b*. Afterwards, the IED updates the debounce timing element 202 as shown at 606 and 614. When the debounce timing element duration has elapsed as shown at 622, the IED updates the data signal value of edge detection element to the same status as the raw data and the IED reverts back to the quiescent state as shown at 608 and 616.

Figure 7:
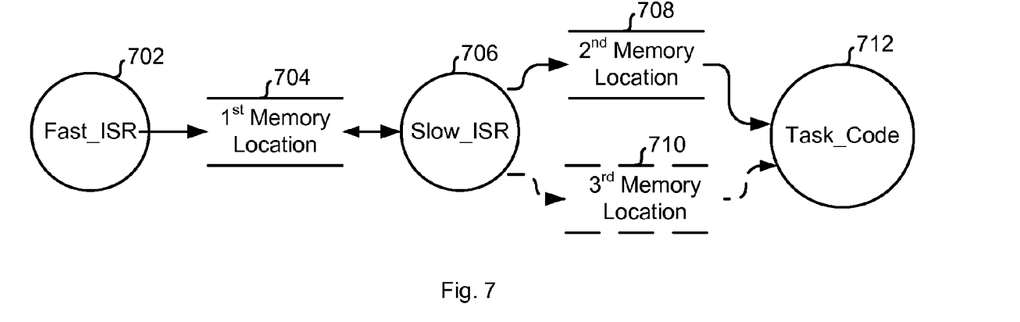
FIG. 7 is flow chart illustrating a method for processing SER data flow in order to facilitate the reduction of processing burden on the IED and optimization of system performance according to an embodiment of the present invention.

The SER 118 of FIG. 1 may include processing having a select data flow. This present invention method facilitates the reduction of processing burden of the IED and optimization of system performance. More specifically, as illustrated in FIG. 7, the SER processing in the IED 102 may involve a combination of routing speeds in order to optimize microprocessor speed and memory storage. This present invention process further provides for a high degree of accuracy of the SER. The embodiment of FIG. 7 is shown to involve a fast interrupt service routing (Fast ISR) 702, a slow interrupt service routing (Slow ISR) 706, and task code 712. Fast ISR 702 runs at a relatively faster processing rate (e.g., about 32 times per power system cycle), whereas the Slow ISR 706 runs at a relatively slower processing rate (e.g., about 4 times per power system cycle). The Fast ISR 702 transmits data to a first memory location 704 (e.g., a history array type structure). From this first memory location 704, the Slow ISR 706 processes the received data to compensate for delay associated with the data. In one embodiment, delay factors may be derived from the time delay element 122 of FIG. 1 and/or calculated from the select settings. The select settings may be entered by a user and, thereby be user adjustable. Furthermore, the IED may be adapted such that the delay settings are calculated during a change of relay settings or upon power up of the IED. Furthermore, in another embodiment, the Slow ISR 706 may further determine whether the data represents a rising edge or falling edge event.

After the delay is processed in the first memory location 704, the Slow ISR 706 populates a second memory location 708 (e.g., a buffer) for further processing. Another memory location 710 may also be provided for storage of data for utilization by the Task Code 712 processing element to perform yet other SER processes (e.g., indexing, analysis, labeling, creating reports, etc.).

Figure 8:
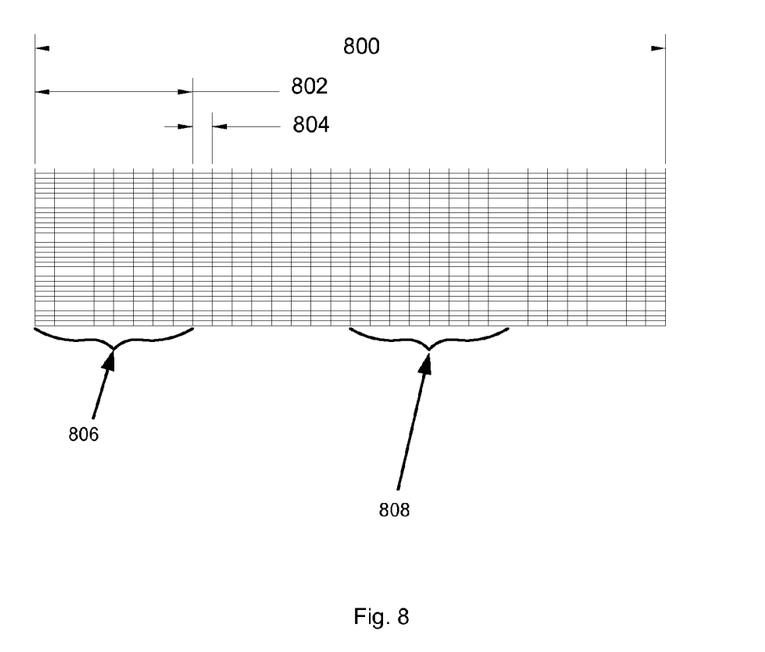
FIG. 8 is an illustration of an embodiment of the first memory location of FIG. 7 according to an embodiment of the present invention.

FIG. 8 illustrates an embodiment of the first memory location 704 of FIG. 7. The first memory location of this embodiment generally includes an array of memory portions 800. A portion of the memory location 802 (e.g., a page of data) is provided for Slow ISR processes. A second, generally much smaller memory location portion 804 (e.g., a slice of data) is allocated for Fast ISR processes. Using this array, the Slow ISR processes the entire first memory location by finding stored SER data in one page (e.g., 808) and moving them to the appropriate slices of a previous page (e.g., 806). In one embodiment, any stored SER data which is moved is deleted from the current page (e.g., 808). When the Slow ISR has finished processing the current page (e.g., wherein all time delays have been compensated), the processed page is then transmitted to a second memory location such as a buffer.

In one specific example, the data stored in the smaller memory location portion 804 for Fast ISR processes may be stored for approximately three Slow ISR intervals before being sent, thereby allowing the Slow ISR to parse each page and modify the SER data of up to two pages (e.g., 806) preceding the current page (e.g., 808). This further allows the ability to correct for up to 7.5 ms of delay at a power system frequency of 66 Hz.

Figure 9:
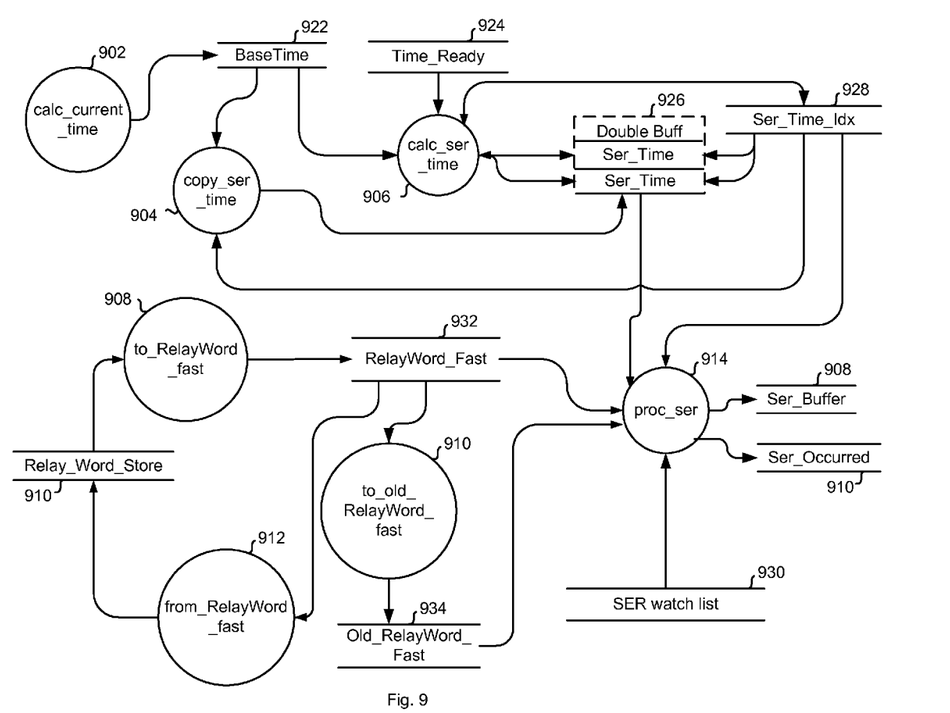
FIG. 9 is a flow chart illustrating a method for processing SER data flow in order to facilitate the reduction of processing burden on the IED and optimization of system performance according to an embodiment of the present invention.
Figure 10:
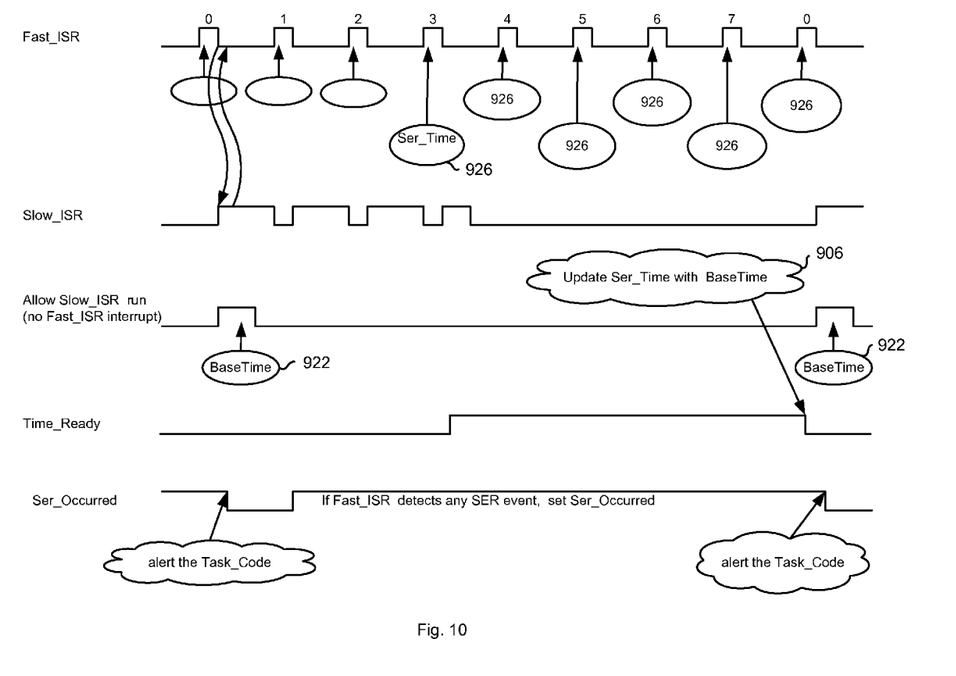
FIG. 10 is a timing diagram of the method for processing SER data flow illustrated in FIG. 9.

In yet another embodiment, the IED may be in the form of a protective relay as shown in FIG. 9 and include the specific processing timing as illustrated in FIG. 10. More specifically, the relay includes a generally similar base data flow structure as that shown and described with respect to FIG. 7. Nevertheless, the relay of FIG. 9 is more complex as it includes a number of optional elements. More specifically, the SER of the relay may include none, any or all of the following optional elements as shown in FIG. 9 and includes the specific processing timing as illustrated in FIG. 10.

The calc_current_time routine 902 may be provided to receive the time from the clock 114 of FIG. 1 and calculate the current time. This calc_current_time routine 902 may be adapted to save current time, synched to the clock 114, to a BaseTime 922 memory location. The copy_ser_time 904 routine may be adapted to copy the BaseTime 922 memory location to a double buffer of a Ser_Time 926 memory location, indexed by Ser_Time_Idx 928 memory location. The calc_ser_time 906 routine may be adapted to receive the time from the BaseTime 922 memory location when flag Time_Ready 924 memory location is set. This calc_ser_time 906 routine may further be adapted to save that new time in the Ser_Time 926 memory location as a SER timestamp at the Fast ISR processing rate.

The SER of the relay may further be adapted to communicate relay word bits. Accordingly, a to_RelayWord_fast 908 routine may be provided to copy a portion of or about the entire relay word bit status from the Relay Word_Store 910 memory location to RelayWord_Fast 932 memory location. Moreover, a to_old_RelayWord_fast 910 routine may further be provided to copy a portion of or about the whole relay word bit status from the RelayWord_Fast 932 memory location to the Old_RelayWord_Fast 934 memory location. This routing may be adapted to keep an updated copy of the Old_RelayWord_Fast 932 memory location for a proc_ser 914 routine to ascertain or view any changes of the relay word bit state.

The from_RelayWord_fast 912 routine may be adapted to copy only digital input related relay word bits from the RelayWord_Fast 932 memory location to the Relay Word Store 910 memory location. This copy will make the fast relay word bits available to the other functions running during the Slow ISR process.

The proc_ser 914 routine may be provided to monitor fast relay word bit status, the RelayWord_Fast 932 memory location, and the Old_RelayWord_Fast 934 memory location to detect any relay word bit status changes. If the detected relay word bits are in the user selected SER watch list 930 memory location, this routine pushes the SER record to the Ser_Buffer 908 memory location with a timestamp from the Ser_Time 926 memory location, indexed by the Ser_Time_Idx 928 memory location. This function may further set the Ser_Occurred 910 memory location when new SER reports are generated. In one embodiment, the Ser_Time 926 is updated in every Fast_ISR using the timing operation as shown in FIG. 10 and as described above. This present invention method facilitates the reduction of processing burden of the IED and optimization of system performance. This present invention process further provides for a high degree of accuracy of the SER.

While this invention has been described with reference to certain illustrative aspects, it will be understood that this description shall not be construed in a limiting sense. Rather, various changes and modifications can be made to the illustrative embodiments without departing from the true spirit, central characteristics and scope of the invention, including those combinations of features that are individually disclosed or claimed herein. Furthermore, it will be appreciated that any such changes and modifications will be recognized by those skilled in the art as an equivalent to one or more elements of the following claims, and shall be covered by such claims to the fullest extent permitted by law.

What is claimed is:

1. An intelligent electronic device for communication with a power system element for protection, monitoring, controlling, metering or automation of a portion of an electrical power system, said power system element communicating a data signal related to a select event associated with the power system element to the intelligent electronic device, the intelligent electronic device comprising:
    a sequential events recorder to receive the data signal and record the select event associated with the power system element,
    a clock in communication with the sequential events recorder, said sequential events recorder associating a time with the select event based on the clock,
    a debounce timing element for detection and compensation of bouncing in the data signal, said debounce timing element producing a delay in the receipt of the data signal by the sequential events recorder, and
    a time delay element coupled to the sequential events recorder, wherein the time delay element compensates for the delay produced by the debounce timing element such that the sequential events recorder records a compensated time for the select event based on the clock and the time of day.

2. The intelligent electronic device of claim 1 wherein the time delay element is a user adjustable time delay element.

3. The intelligent electronic device of claim further including at least one mechanical contact input for communication with the power system element, wherein the time delay element further compensates for contact input delay between the intelligent electronic device and the power system element.

4. The intelligent electronic device of claim 1 wherein the intelligent electronic device is in network communication with the power system element, wherein the time delay element further compensates for network communication delay between the intelligent electronic device and the power system element.

5. The intelligent electronic device of claim 4 wherein the communication between the intelligent electronic device and the power system element is based on a select network protocol.

6. The intelligent electronic device of claim 5 wherein the select network protocol is selected from the group consisting of HAYES, SMI, DNP, AGA, SEL, DDF, MODBUS, IEC-61850, PROFIBUS, and unstructured messaging protocols, and wherein the time delay element compensates for communication delay associated with the select network protocol.

7. The intelligent electronic device of claim 1 wherein the time delay element is further adapted to compensate for hardware communication delay between elements associated with the intelligent electronic device.

8. The intelligent electronic device of claim 1 wherein the clock is an absolute time reference.

9. The intelligent electronic device of claim 8 wherein the absolute time reference is a Global Positioning System (GPS) clock.

10. The intelligent electronic device of claim 1 wherein the clock is a local clock.

11. The intelligent electronic device of claim 1 wherein the power system element is selected from the group consisting of an electrical generator, electrical motor, power transformer, power transmission line, distribution line, bus, capacitor, circuit breaker, and disconnect switch.

12. The intelligent electronic device of claim 1 wherein the intelligent electronic device is selected from the group consisting of a sequential events recorder (SER), protective relay, remote terminal unit (RTU), power line communication device (PLC), bay controller, supervisory control and data acquisition (SCADA) system, general computer system, and meter.

13. The intelligent electronic device of claim 1 wherein the select event is related to a change of status of the power system element.

14. The intelligent electronic device of claim 1 wherein the select event includes an intelligent electronic device word bit.

15. The intelligent electronic device of claim 14 wherein the intelligent electronic device word bit includes at least one binary state.

16. The intelligent electronic device of claim 15 wherein the binary state is selected from the group consisting of logic inputs for protection, monitoring, controlling, metering or automation functions associated with the power system element; logic outputs for protection, monitoring, controlling, metering or automation functions associated with the power system element, general operation of the power system element; power up sequences of the power system element; and shutdown sequences of the power system element.

17. The intelligent electronic device of claim 1 wherein the debounce timing element is a fixed debounce timing element.

18. The intelligent electronic device of claim 1 wherein the debounce timing element is a programmable debounce timing element.

19. The intelligent electronic device of claim 1 further comprising a edge detection element for detection of a rising or falling edge associated with the data signal.

20. The intelligent electronic device of claim 18 further comprising a edge detection element for detection of a rising or falling edge associated with the data signal.

21. The intelligent electronic device of claim 1 wherein the sequential events recorder further generates a report including a plurality of select events.

22. The intelligent electronic device of claim 21 wherein the sequential events recorder indexes the select events in chronological order based on the compensated time associated with each select event.

23. The intelligent electronic device of claim 21 wherein the report includes information selected from the group consisting of date, time, power system element name, power system element type, and event associated with the power system element.

* * * * *